United States Patent [19]
Ishibashi et al.

[11] Patent Number: 6,049,221
[45] Date of Patent: Apr. 11, 2000

[54] SEMICONDUCTOR INTEGRATED CIRCUIT SYSTEM HAVING FUNCTION OF AUTOMATICALLY ADJUSTING OUTPUT RESISTANCE VALUE

[75] Inventors: Kenichi Ishibashi, Kokubunji; Takehisa Hayashi, Sagamihara; Tsutomu Goto, Yokohama; Hideki Murayama, Kunitachi; Akira Yamagiwa, Kanagawa-ken; Yasuhiro Ishii, Hadano; Naoki Hamanaka, Tokyo; Masabumi Shibata, Kawasaki, all of Japan

[73] Assignee: Hitachi, Ltd., Tokyo, Japan

[21] Appl. No.: 09/111,804

[22] Filed: Jul. 8, 1998

[30] Foreign Application Priority Data

Jul. 8, 1997 [JP] Japan ................................. 9-182886

[51] Int. Cl.$^7$ ..................... H03K 19/003; H03K 19/175
[52] U.S. Cl. ............................. 326/30; 326/32; 326/86; 326/26; 326/82; 326/31
[58] Field of Search ................................. 326/30, 31, 32, 326/34, 86, 82, 83, 87, 26, 27

[56] References Cited

U.S. PATENT DOCUMENTS

| | | | |
|---|---|---|---|
| 4,719,369 | 1/1988 | Asano et al. | 326/30 |
| 5,220,211 | 6/1993 | Christopher et al. | 326/90 |
| 5,572,395 | 11/1996 | Rasums et al. | 361/58 |
| 5,666,078 | 9/1997 | Lamphier et al. | 327/108 |
| 5,680,060 | 10/1997 | Banniza et al. | 326/30 |
| 5,808,478 | 9/1998 | Andresen | 326/31 |
| 5,955,894 | 9/1999 | Vishwanthaiah et al. | 326/86 |

OTHER PUBLICATIONS

Takahashi et al., "WP 2.5: A CMOS Gate Array with 600Mb/s Simultaneous Bidirectional I/O Circuits", Digest of Technical Papers of Int'l Solid–State Circuits Conference, Feb. 1995, pp. 40–41.

*Primary Examiner*—Michael Tokar
*Assistant Examiner*—James H Cho
*Attorney, Agent, or Firm*—Antonelli, Terry, Stout & Kraus, LLP

[57] ABSTRACT

A semiconductor integrated circuit system having a function of automatically adjusting an output resistance value with reference to a temperature of an LSI which is operating. When a count value obtained from a counter by counting the output of a timer becomes equal to a predetermined value, a temperature sensor measures temperatures of LSIs. If a temperature fluctuation measured from a previous measured value is greater than a predetermined width, then a control apparatus issues an output resistance value adjustment request signal to output resistance adjustment units of the LSIs. When receiving the output resistance value adjustment request signal, the output resistance value adjustment units stop the signal transmission between the LSIs, adjust output resistance values of output circuits in such a manner that the output resistance values are matched with a characteristic impedance of a transmission line, and maintains the adjusted output resistance values until the output resistance value adjustment units receive next output resistance value adjustment request signal.

16 Claims, 10 Drawing Sheets

SEMICONDUCTOR INTEGRATED CIRCUIT SYSTEM HAVING FUNCTION OF AUTOMATICALLY ADJUSTING OUTPUT RESISTANCE VALUE

BACKGROUND OF THE INVENTION

The present invention relates to a semiconductor integrated circuit system for transmitting a signal among a plurality of LSI circuits (Large Scale Integrated Circuits) through transmission lines, and more particularly to a semiconductor integrated circuit system having a function of automatically adjusting an output resistance value of an LSI output circuit.

When an output resistance value of an LSI output circuit has a mismatching with an impedance of a transmission line, a reflected wave occurs in a transmitted signal and becomes a noise factor, thereby making it impossible to transmit the signal at a high speed. In order to transmit a signal at a high speed, the output resistance value of the LSI's output circuit has to be matched with the impedance of the transmission line accordingly.

U.S. Pat. No. 4,719,369 (J-P-A-62-38616) and Digest of Technical Papers of International Solid-State Circuits Conference 95 (February, 1995, pp. 40–41) entitled "A CMOS Gate array with 600 Mb/s Simultaneous Bidirectional I/O Circuits" describe technologies in which an output circuit having a plurality of MOS (Metal Oxide Semiconductor) circuits, each having a different gate width (i.e. different internal resistance value), arrayed in parallel to each other is used as an LSI output circuit and an output resistance value is matched with the characteristic impedance of a transmission line by selectively supplying an input to the gates of these MOS transistors, thereby resulting in an impedance matching being effected. The disclosures of U.S. Pat. No. 4,719,369 and the Digest of Technical Papers are hereby incorporated by reference.

SUMMARY OF THE INVENTION

An output resistance value of LSI is considerably influenced by a temperature. Accordingly, it is meaningless to adjust the output resistance value at a temperature different from the temperature of the LSI which is operating normally.

However, so far the above-mentioned prior art has never considered the temperature of the LSI used when the output resistance value is adjusted.

Also, when a printed circuit board is inserted into a semiconductor integrated circuit system in a hot-plug-in fashion, the adjustment of the output resistance value of the output circuit of the LSI mounted on the printed circuit board has not been considered at all so far. Note that the "hot-plug-in" means inserting a printed circuit board into the semiconductor integrated circuit system during the semiconductor integrated circuit system is operating.

Therefore, it is a first object of the present invention to provide a semiconductor integrated circuit system having a function of automatically adjusting an output resistance value at a temperature close to a temperature of an LSI which is operating normally.

It is a second object of the present invention to provide a semiconductor integrated circuit system having a function of automatically adjusting an output resistance value of an output circuit of an LSI mounted on a printed circuit board when the printed circuit board is inserted into the semiconductor integrated circuit system in a hot-plug-in fashion.

According to a first aspect of the present invention, there is provided a semiconductor integrated circuit system in which a signal is transmitted among a plurality of semiconductor integrated circuit devices (hereinafter referred to as LSIs) through a transmission line. This semiconductor integrated circuit system comprises an adjustment request signal issuing unit for issuing an output resistance value adjustment request signal at an occasion such as during a power-on reset, after a constant time since the power-on reset has been released, at a constant time interval or when any one of temperature fluctuations of a plurality of LSIs exceeds a predetermined width, and output resistance value adjustment units for stopping the signal transmission among a plurality of LSIs in response to issuance of the output resistance value adjustment request signal from the adjustment request signal issuing unit and adjusting output resistance values of the plurality of LSIs. The output resistance value adjustment unit adjusts the output resistance value of an output circuit of each LSI in such a manner that the output resistance value may approach a characteristic impedance of the transmission line.

The semiconductor integrated circuit system according to the first aspect adjusts the output resistance value at at least any one of the following timings. That is, (1) during power-on reset;

(2) after a constant time since the power-on reset has been released;

(3) at a constant time interval; and (4) when a temperature fluctuation of LSI exceeds a predetermined width.

In the above-mentioned timing (1), when the power-on reset is executed frequently during the LSI is operating normally, since the temperature of the LSI becomes almost equal to the temperature obtained in the normal operation even during the power-on reset, the output resistance value may automatically be adjusted by the temperature of the LSI. Also, during the power-on reset, the signal transmission is stopped so that the output resistance value may be adjusted without causing a malfunction. Note that the power-on reset is an initializing operation occurring for a predetermined period of time immediately after turning the system on.

In the above-mentioned timing (2), when the temperature of the LSI is substantially constant after a constant time since the power-on reset has been released, the output resistance value may automatically be adjusted by the temperature of the LSI. Moreover, since the signal transmission is stopped when the output resistance value is adjusted, the output resistance value may be adjusted without causing a malfunction.

In the above-mentioned timing (3), when the temperature of the LSI which is operating is considerably fluctuated, the output resistance value may automatically be adjusted by the temperature of the LSI as fluctuated. Moreover, when the output resistance value is adjusted, the signal transmission is stopped so that the output resistance value may be adjusted without causing a malfunction.

In the above-mentioned timing (4), when the temperature of the LSI which is operating is considerably fluctuated, the output resistance value may automatically be adjusted by the temperature of the LSI as fluctuated. Moreover, when the output resistance value is adjusted, the signal transmission is stopped so that the output resistance value may be adjusted without causing a malfunction. Further, when the fluctuation of the temperature is small, the output resistance value need not be adjusted so that the chance for stopping the signal transmission is reduced, thereby making it possible to reduce an overhead.

According to a second aspect of the present invention, in the aforementioned semiconductor integrated circuit system, the output resistance value adjustment request signal is supplied to the output resistance value adjustment unit through a signal line provided separately from ordinary signal transmission lines.

In the semiconductor integrated circuit system according to the second aspect, since the output resistance value adjustment request signal is supplied to the output resistance value adjustment unit through the signal line provided separately of the ordinary signal transmission lines, there is then the advantage that an ordinary signal transmission system need not be changed when implementing the invention.

According to a third aspect of the present invention, in the aforementioned semiconductor integrated circuit system, the output resistance value adjustment request signal is supplied through an ordinary signal transmission line to the output resistance value adjustment unit.

In the semiconductor integrated circuit system according to the third aspect, since the output resistance value adjustment request signal is supplied through the ordinary signal transmission line to the output resistance value adjustment unit, there is then the advantage that the number of signal lines need not be increased.

According to a fourth aspect of the present invention, the aforementioned semiconductor integrated circuit system further includes a switch for relaying the signal transmission among a plurality of LSIs, wherein the output resistance value request signal is supplied from the switch through an ordinary signal transmission line to the output resistance value adjustment unit.

In the semiconductor integrated circuit system according to the fourth aspect, since the output resistance value request signal is supplied through the switch and the ordinary signal transmission line to the output resistance value adjustment unit, there is then the advantage that the number of signal lines need not be increased.

According to a fifth aspect of the present invention, there is provided a semiconductor integrated circuit system in which a signal is transmitted among a plurality of semiconductor integrated circuit devices (hereinafter referred to as LSIS) through a transmission line, wherein the semiconductor integrated circuit system includes a control signal issuing unit for issuing a hot-plug-in information control signal when a printed circuit board is inserted into the semiconductor integrated circuit system in a hot-plug-in fashion and an output resistance value adjustment unit for adjusting output resistance values of the LSIs mounted on the printed circuit board when the hot-plug-in information control signal is issued.

In the semiconductor integrated circuit system according to the fifth aspect, when the printed circuit board is inserted into this semiconductor integrated circuit system, it is possible to automatically adjust the output resistance values of the output circuits of the LSIs mounted on the printed circuit board.

DESCRIPTION OF THE PREFERRED EMBODIMENTS

Figure 1:
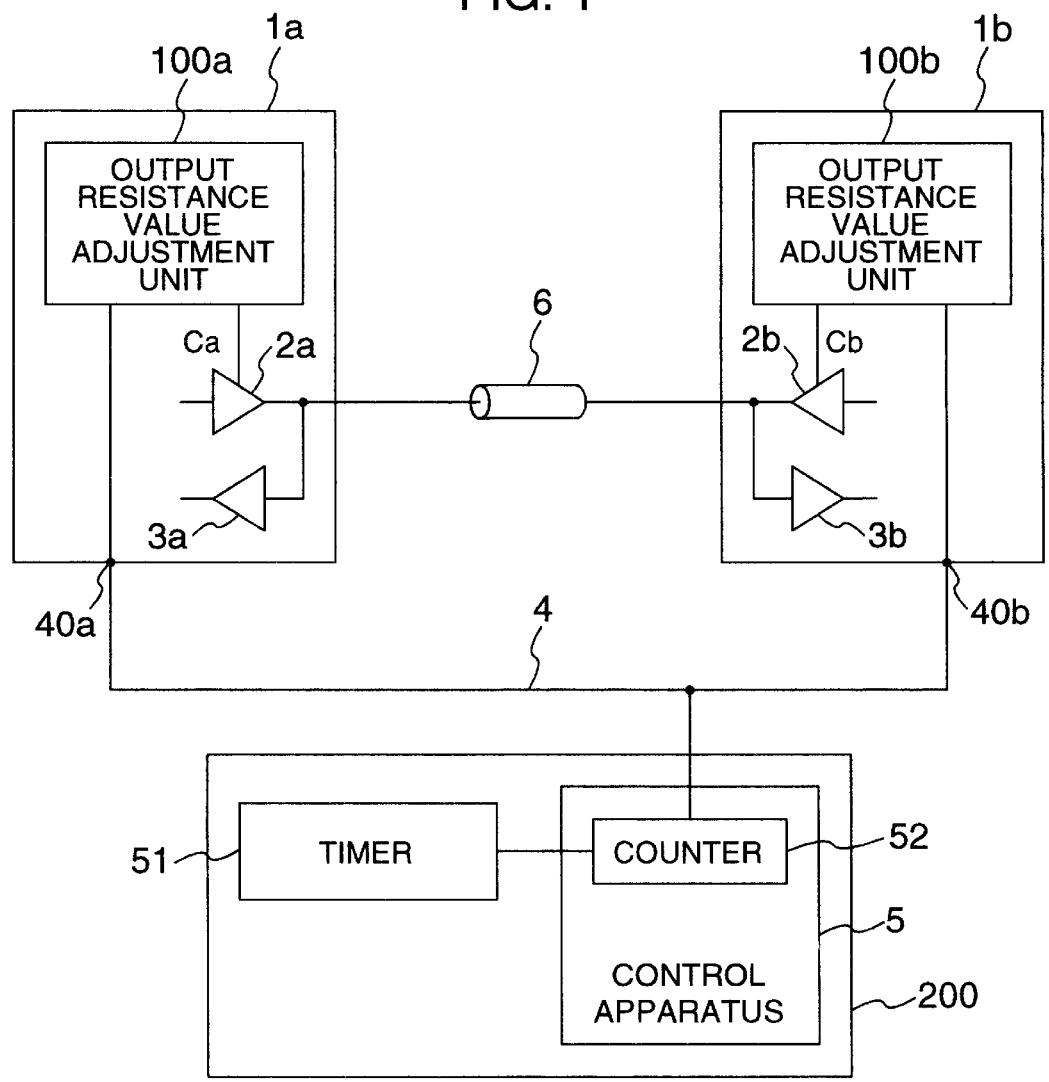
FIG. 1 is a block diagram showing a semiconductor integrated circuit system according to an embodiment of the present invention.

Embodiments of the present invention will hereinafter be described with reference to the drawings. It should be noted that these embodiments are not intended to limit the scope of the present invention. Throughout all figures of drawings, like elements and parts are marked with the like reference numerals.

FIG. 1 of the accompanying drawings is a block diagram showing a semiconductor integrated circuit system according to an embodiment of the present invention.

As shown in FIG. 1, a semiconductor integrated circuit 1000 includes LSIs 1a, 1b, a transmission line 6 and an adjustment request signal issuing unit 200.

The LSIS 1a and 1b are mounted on the same printed circuit board or different printed circuit boards and include output circuits 2a, 2b, input circuits 3a, 3b and output resistance value adjusting units 100a, 100b for adjusting output resistance values of the output circuits 2a, 2b by control signals Ca, Cb.

The transmission line 6 is a cable for inter-connecting wirings on the same printed circuit board or interconnecting different printed circuit boards, and has a predetermined characteristic impedance.

The adjustment request signal issuing unit 200 includes a timer 51 for outputting a signal at a constant time interval and a control apparatus 5, such as a service processor (SVP), which has a built-in counter 52 for counting the outputs of the timer 51.

The control apparatus 5 in the adjustment request signal issuing unit 200 issues an output resistance value adjustment request signal 4 to the output resistance value adjustment units 100a, 100b of the LSIs 1a, 1b when power-on reset takes place and also when the counter 52 outputs a predetermined count value n. The output resistance value adjustment units 100a, 100b receive the output resistance value adjustment request signal 4 through pins 40a, 40b on the LSIs 1a, 1b and stop the signal transmission between the LSIs 1a and 1b, match the output resistance values of the output circuits 2a, 2b with the characteristic impedance of the transmission line 6 by a well-known method such as one disclosed in U.S. Pat. No. 4,719,369 (JP-A-62-38616) or Digest of Technical Papers of International Solid-state Circuit Conference 95 (February 1995, pp. 40–41), and maintain the output resistance values until they receive next output resistance value adjustment request signal 4. The adjustment of the output resistance values will be described in detail later on.

Figure 2:
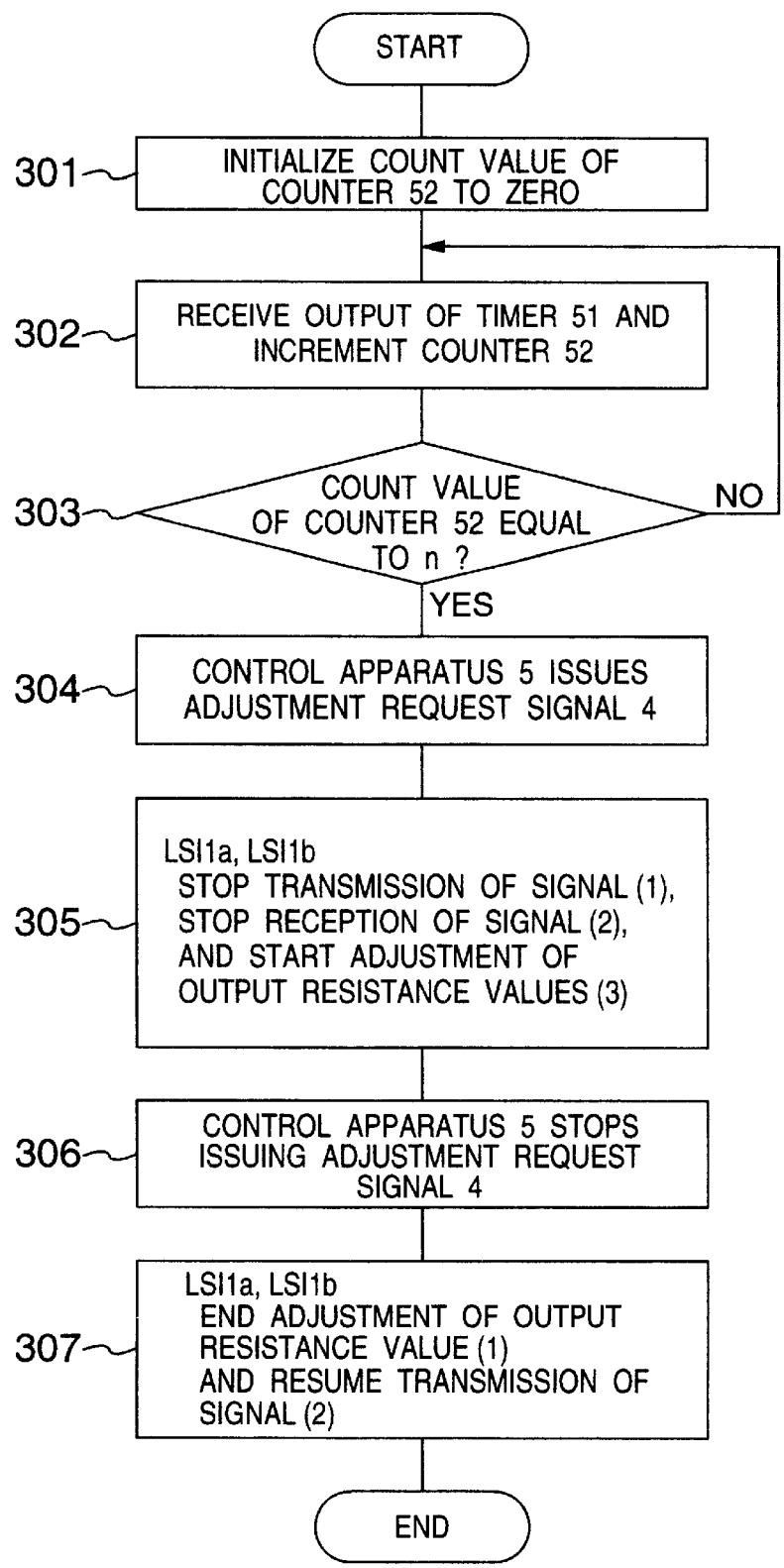
FIG. 2 is a flowchart of the operation in which an output resistance value is adjusted after a power-on reset of the semiconductor integrated circuit system according to the embodiment shown in FIG. 1.

FIG. 2 is a flowchart in accordance with which the semiconductor integrated circuit system 1000 adjusts the output resistance value after power-on reset.

Referring to FIG. 2, following the start of operation, the counter 52 is initialized to "0" in step 301. In the next step 302, the counter 52 is incremented each time the output of the timer 51 is received. It is determined in the next decision step 303 whether or not the count value of the counter 52 reaches n (n is an integer equal to or greater than 1 corresponding to the time when the temperatures of the LSIs 1a, 1b increase and become substantially constant). If the count value of the counter 52 does not reach n as represented by a NO in the decision step 303, then control goes back to the step 302. If on the other hand the count value of the counter 52 reaches n as represented by a YES in the decision step 303, then control goes to the next step 304.

In the step 304, the control apparatus 5 issues the output resistance value adjustment request signal 4 to the LSIs 1a, 1b.

In the next step 305, the output resistance value adjustment units 100a, 100b of the LSIs 1a, 1b receive the output resistance value adjustment request signal 4, respectively stop the transmission of the signals from the LSIs 1a, 1b, stop the reception of the signals at the right timing in which the reception of the signal from the other LSI is completed, and start the adjustment of the output resistance values of the output circuits 2a, 2b.

In a step 306, the control apparatus 5 stops issuing the output resistance value adjustment request signal 4 to the LSIs 1a, 1b.

In a step 307, the LSIs 1a, 1b end the adjustment of the output resistance values and resumes the signal transmission and signal reception. Thus, a series of output resistance value adjustment is ended. Since the adjustment of the output resistance value is executed in a time period of several $\mu$s and the temperature of the LSI is substantially kept constant after signal transmission is stopped, the output resistance value can be adjusted at a temperature obtained in the normal operation.

Figure 3:
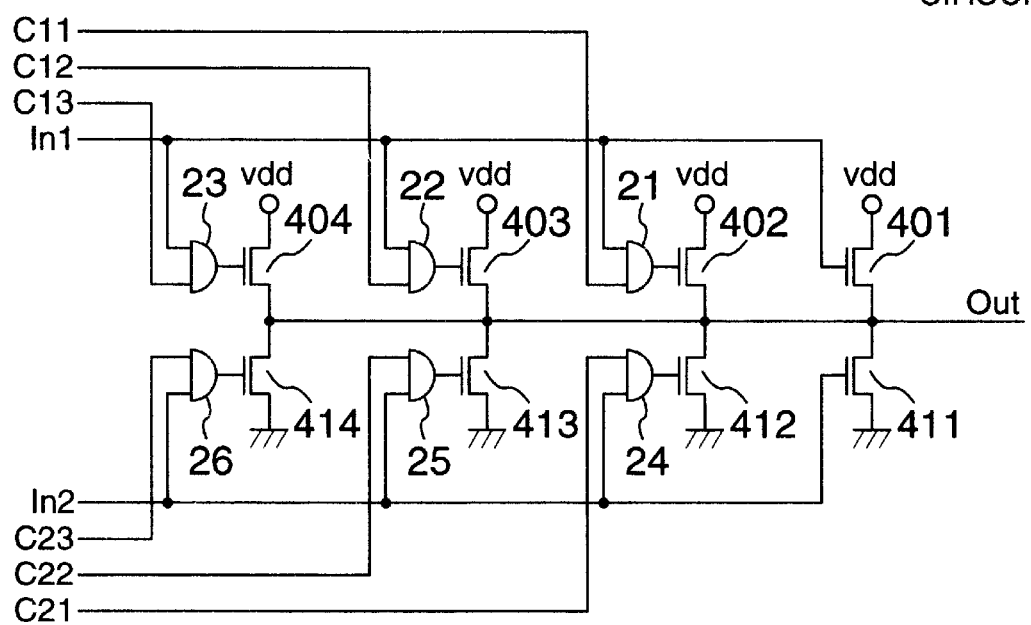
FIG. 3 is a block diagram showing an output circuit provided in each semiconductor integrated circuit.

FIG. 3 is a block diagram showing the output circuit 2 more in detail. Incidentally, output circuits 2a, 2b are common in configuration, and therefore suffixes a, b are omitted.

Reference numerals In1, In2 depict input signals inputted to the output circuit 2. The input signals In1, In2 are complementary signals. Reference letter Out depicts an output signal outputted from the output circuit 2. Reference numerals 401 to 404 and 411 to 414 respectively depict nMOS transistors (pMOS transistors also may be used) having different gate width as in a relationship of W, 2W, 4W, 8W, for example, and which accordingly has also corresponding output resistance values. Reference numerals 21 to 26 depict AND circuits, respectively. Reference numerals C11 to C13, C21 to C23 depict control signals for turning on and off the nMOS transistors 402 to 404, 412 to 414. Reference letter Vdd depicts a power supply source for supplying a voltage to the nMOS transistors 404 to 404, the AND circuits 21 to 26 and the inside of the LSI.

Although the resistance values of the nMOS transistors 401 to 404 and 411 to 414 are fluctuated due to influences such as a process variation, a temperature and a power source voltage, if the control signals C11 to C13 and C21 to C23 are set to proper values and the nMOS transistors are properly combined in use, then equivalent resistance values of the nMOS transistors 401 to 404 which outputs high level outputs and the nMOS transistors 411 to 414 which output low level outputs can be matched with the characteristic impedance of the transmission line 6.

Figure 4:
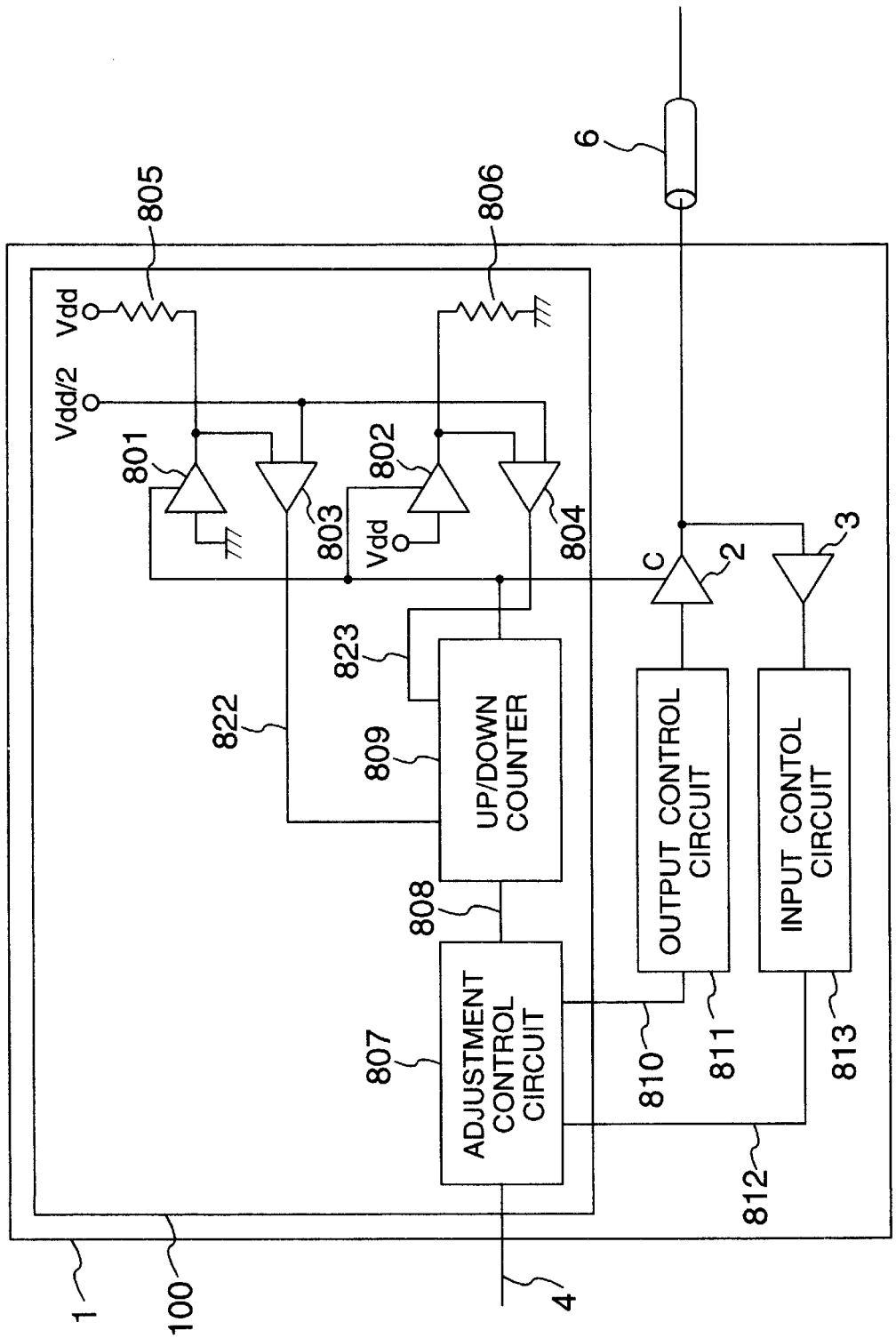
FIG. 4 is a block diagram showing an output resistance value adjusting unit for adjusting an output resistance value of an output circuit more in detail.

FIG. 4 is a block diagram showing the output resistance value adjusting unit 100 more in detail. Incidentally, the configurations of the output resistance value adjusting units 100a, 100b, LSIs 1a, 1b, the output circuits 2a, 2b, the input circuits 3a, 3b and the control signals Ca, Cb are common, and therefore suffixes a, b need not be used herein.

Reference numeral 801 depicts an output resistance value monitor output circuit for adjusting the output resistance values of the nMOS transistors 411 to 414 which output low level outputs and which have the same configuration as that of the output circuit 2. Reference numeral 802 depicts an output resistance value monitor output circuit for adjusting the output resistance values of the nMOS transistors 401 to 404 which output high level outputs and which have the same configuration as that of the output circuit 2. Reference numerals 803, 804 depict differential amplifiers, respectively. Reference numerals 805, 806 depict resistors having resistance values equal to the characteristic impedance of the transmission line 6, respectively. These resistors 804, 806 may be disposed within the LSI 1 or alternatively may be disposed outside of the LSI 1. Reference numeral 807 depicts an adjustment control circuit for issuing control signals 808, 810 and 812. Reference numeral 809 depicts an up/down counter which may operate only during a period of the power-on reset or during the time when the control signal 808 is issued. Reference numeral 811 depicts an output control circuit, and reference numeral 813 depicts an input control circuit, respectively.

When the output resistance value adjustment request signal 4 is issued, the adjustment control circuit 807 issues the control signal 810 to the output control circuit 811, and stops signal transmission. Also, since signal transmission from the other LSI is stopped substantially simultaneously, after a predetermined time elapses since stopping of signal transmission, the adjustment control circuit 807 issues the control signal 812 to the input control circuit 813, and stops the reception of the signal.

Then, the adjustment control circuit 807 issues the control signal 808 to the up/down counter 809, and starts the adjustment of the output resistance value.

The differential amplifiers 803, 804 each output a high level signal 822 to the up/down counter 809 via signal lines 822, 823, respectively, when a potential at a junction between the output resistance value monitor output circuit 801 and the resistor 805 and a junction between the output resistance value monitor output circuit 802 and the resistor 806 is higher than Vdd/2, and output a low level signal to the up/down counter 809 via the signal lines 822, 823, respectively, when the above-mentioned potentials are lower than Vdd/2.

The up/down counter 809 sets the control signal C to a proper value in such a fashion that the potential at the junction between the output resistance value monitor output circuits 801, 802 and the resistors 805, 806 becomes equal to Vdd/2, i.e. the output resistance values of the output resistance value monitor output circuits 801, 802 become equal to the resistance values of the resistors 805, 806.

Since the control signal C is also inputted to the output circuit 2, the output resistance value of the output circuit 2 becomes equal to the output resistance values of the output resistance value monitor output circuits 801, 802. That is, the output resistance value of the output circuit 2 becomes equal to the characteristic impedance of the transmission line 6.

When the output resistance value adjustment request signal 4 is suppressed, the adjustment control circuit 807 suppresses the control signal 808, and ends the adjustment. Further, the control signals 810, 812 are suppressed, and signal transmission is resumed.

Figure 10:
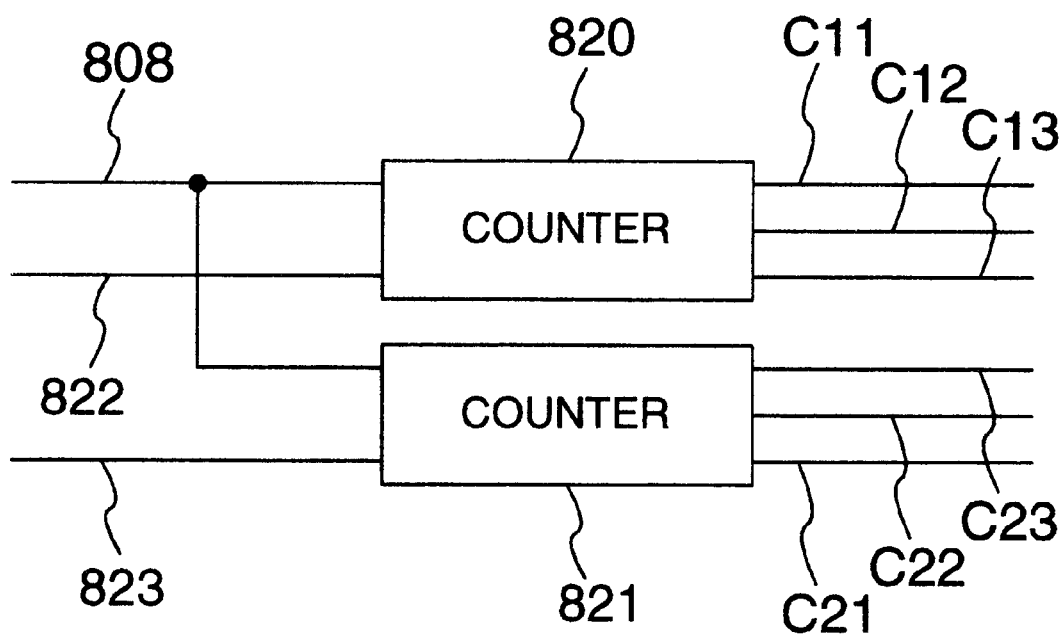
FIG. 10 is a block diagram showing more in detail an up/down counter provided in the output resistance value adjusting unit shown in FIG. 4.

FIG. 10 is a block diagram showing the up/down counter 809 shown in FIG. 4 more in detail. In FIG. 10, reference numeral 820, 821 depict counters which are operated during a period in which the adjustment control circuit 807 issues the control signal 808. The counters 820, 821 count outputs C11 to C13 and C21 to C23 in an incremental or decremental fashion in response to the outputs 822, 823 of the differential amplifiers 803, 804. The outputs C11 to C13 and C21 to C23 correspond to the output C of FIG. 4 and the outputs C11 to C13 and C21 to C23 of FIG. 3.

According to the above-mentioned semiconductor integrated circuit system 1000, since the output resistance value is adjusted during the period of power-on reset, even when the temperatures of the LSIs 1a, 1b are low immediately after the power-on reset, the impedances can be matched. When the temperatures of the LSIs 1a, 1b rise and become substantially constant after the power-on reset, the output resistance values are adjusted again so that the impedances may be matched even though the temperatures of the LSIs 1a, 1b increase owing to the operation. Further, when the output resistance values are adjusted after the power-on reset, the transmission of the signal is stopped, whereby the output resistance values can be adjusted without malfunction.

When the fluctuations of the temperatures of the LSIs 1a, 1b are large during the ordinary operation, the flowchart of FIG. 2 may be repeated and the adjustment of the output resistance values may be repeated at every constant time. At that time, the value of n is determined in consideration of the speed of the fluctuation of the temperature.

Also, in the flowchart of FIG. 2, the transmission of the signal is stopped and the adjustment of the output resistance values is started by issuing the output resistance value adjustment request signal 4. Then, the adjustment of the output resistance value is ended and the transmission of the signal is resumed by prohibiting the output resistance value adjustment request signal 4. The present invention, however, is not limited thereto. That is, the counting of the counter disposed within the LSIs 1a, 1b may be started from a time point in which the output resistance value adjustment request signal 4 is received. Then, in response to the count value, the transmission of the signal may be stopped, the adjustment of the output resistance value may be started, the adjustment of the output resistance value may be ended, and the transmission of the signal may be resumed.

While the signal is transmitted between a pair of LSIs in FIG. 1 as described above, the present invention is not limited thereto, and even in the bus configuration in which a signal is transmitted among three LSIs or more, the output resistance value may be adjusted by a similar method.

Figure 5:
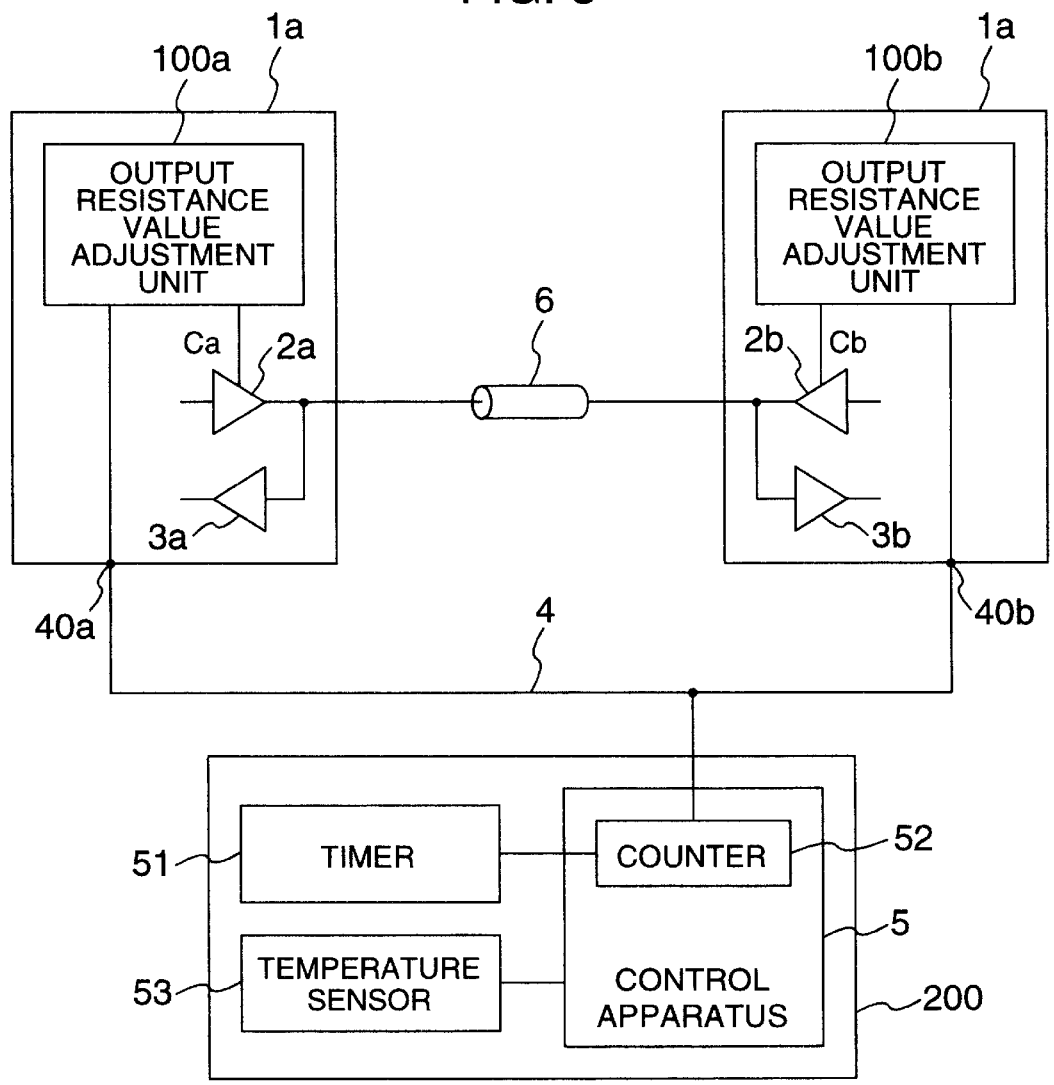
FIG. 5 is a block diagram showing a semiconductor integrated circuit system according to another embodiment of the present invention.

FIG. 5 is a block diagram showing a semiconductor integrated circuit system according to another embodiment of the present invention.

As shown in FIG. 5, this semiconductor integrated circuit system 2000 differs from the semiconductor integrated circuit system 1000 of the above-mentioned embodiment in that the adjustment request signal issuing unit 200 includes a temperature sensor 53.

The temperature sensor 53 is able to directly or indirectly monitor the temperatures of the LSIs 1a, 1b.

Figure 6:
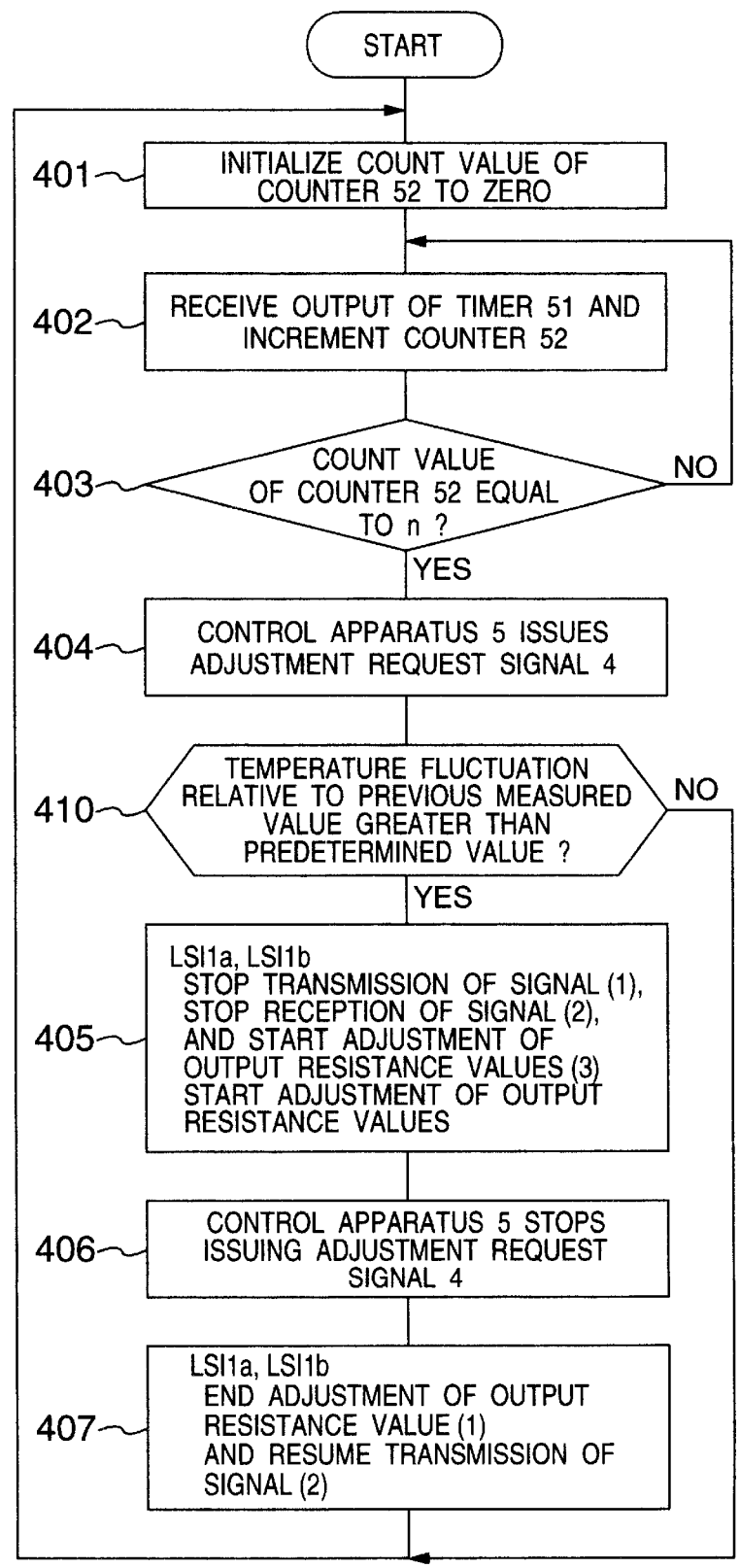
FIG. 6 is a flowchart of the operation in which an output resistance value is adjusted after a power-on reset of the semiconductor integrated circuit system according to the embodiment shown in FIG. 5.

FIG. 6 is a flowchart used to explain the manner in which the semiconductor integrated circuit system adjusts the output resistance value after power-on reset.

Referring to FIG. 6, and following the start of operation, the counter 52 is initialized to "zero" in step 401. In the next step 402, the counter 52 is incremented each time the output of the timer 51 is received. In the next decision step 403, it is determined whether or not the count value of the counter 52 reaches n (value of n is determined in consideration of the speed of the fluctuation of the temperature). If the count value of the counter 52 does not yet reach n as represented by a NO in the decision step 403, then control goes back to the step 402. If on the other hand the value of the counter 52 reaches n as represented by a YES in the decision step 403, then control goes to a step 404.

In the step 404, the control apparatus 5 issues the output resistance value adjustment request signal 4 to the LSIs 1a, 1b. Then, control goes to a step 410.

In the step 410, the temperatures of the LSIs 1a, 1b are measured by the temperature sensor 53. If the temperatures are fluctuated over a predetermined width or more from the previously-measured values as represented by a YES at the step 410, then control goes to a step 405. If not, then control goes back to the step 401.

In the step 405, the output resistance value adjustment units 100a, 100b of the LSIs 1a, 1b receive the output resistance value request signal 4, stop the signal transmission from the LSIs 1a, 1b, stop the signal reception at a timing at which the signal reception from other LSIs is expected to end, and start the adjustment of the output resistance values of the output circuits 2a, 2b.

In the next step 406, the control apparatus 5 stops issuing the output resistance value adjustment request signal 4 to the LSIs 1a, 1b.

In the next step 407, the LSIs 1a, 1b stop the adjustment of the output resistance values, and resume the signal transmission and the signal reception. Then, control goes back to the step 401.

According to the above-mentioned semiconductor integrated circuit system 2000, since the output resistance values are adjusted during the power-on reset, the impedances may be matched even when the temperatures of the LSIs 1a, 1b are low immediately after the power-on reset. Also, after the power-on reset, if the temperatures of the LSIs 1a, 1b are fluctuated much more than the predetermined width, then the output resistance values are adjusted again. Therefore, even when the temperatures of the LSIs 1a, 1b are fluctuated due to the operations of the LSIs 1a, 1b, the impedances can be matched. Further, since the signal transmission is stopped when the output resistance values obtained after the power-on reset are adjusted, it is possible to adjust the output resistance values without causing the malfunction.

Figure 7:
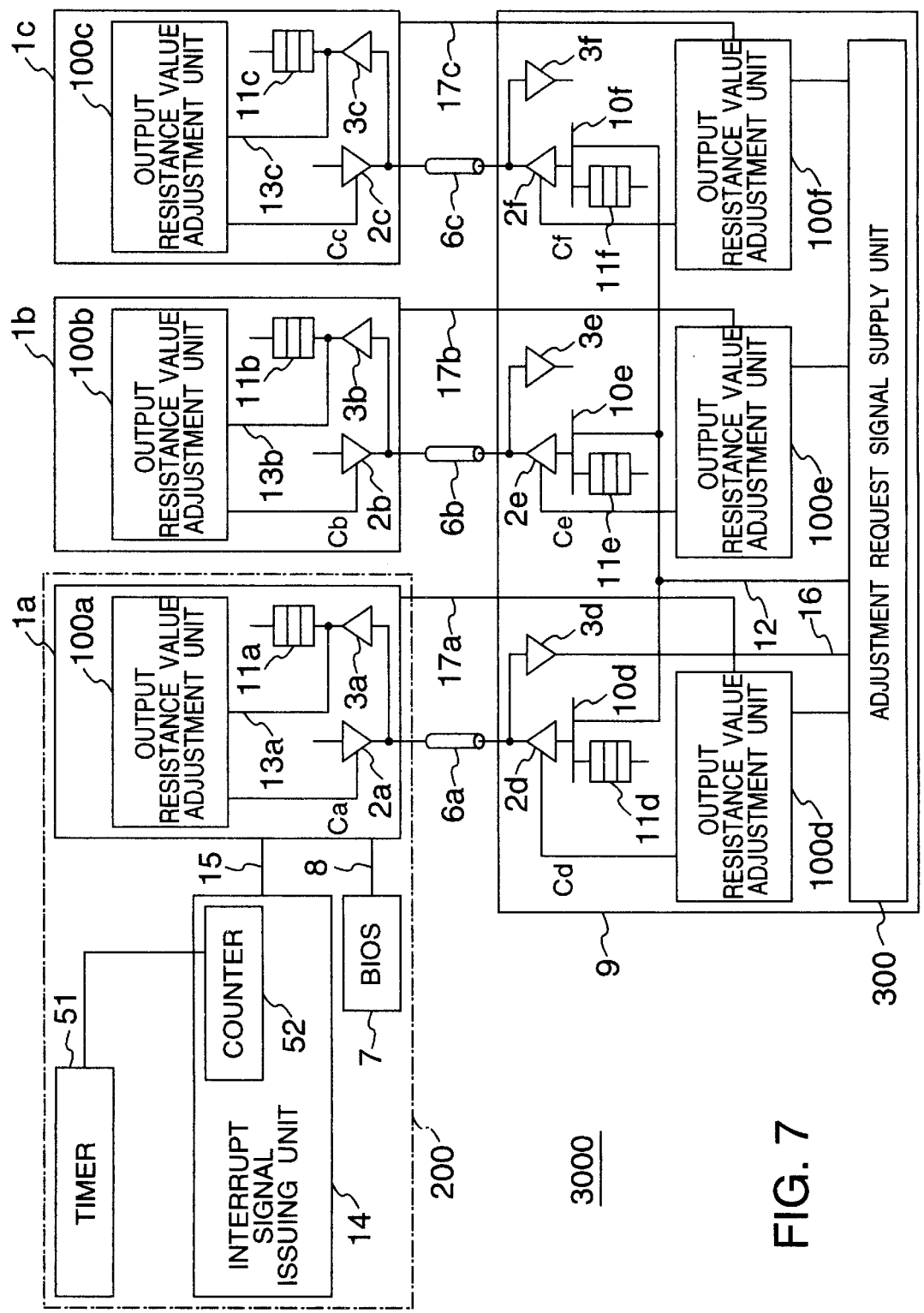
FIG. 7 is a block diagram showing a semiconductor integrated circuit according to still another embodiment of the present invention.

FIG. 7 is a block diagram showing a semiconductor integrated circuit system according to a still another embodiment of the present invention.

As shown in FIG. 7, a semiconductor integrated circuit system 3000 includes LSIs 1a, 1b and 1c, transmission lines 6a to 6c, a switch 9 for relaying the signal transmission among the transmission lines 6a to 6c, hot-plug-in information control signal lines 17a to 17c for informing the hot-plug-in, a timer 51 for outputting a signal at constant time intervals, an interrupt signal issuing unit 14 having a built-in counter 52 for counting the number of the outputs from the timer 51, an interrupt signal line 15, a basic input/output system (BIOS) 7 and an address/data line 8 for allowing the LSI 1a to read/write the BIOS 7.

The LSI 1a, the timer 51, the interrupt signal issuing unit 14 and the BIOS 7 in combination function as an adjustment request signal issuing unit 200.

The LSIs 1a, 1b and 1c are mounted on the same printed circuit board or different printed circuit boards, and include output circuits 2a to 2c, input circuits 3a to 3c, registers 11a to 11c for temporarily storing transmission and reception data, output resistance value adjustment units 100a to 100c for adjusting the output resistance values of the output circuits 2a to 2c by control signals Ca to Cc and data lines 13a to 13c for receiving the output resistance value adjustment request signal.

The transmission lines 6a, 6b and 6c are cables for interconnecting the wirings on the same printed circuit board or interconnecting different printed circuit boards, and have predetermined characteristic impedances.

The switch 9 is formed of one or more LSIs, and includes output circuits 2d, 2e and 2f, input circuits 3d, 3e and 3f, registers 11d, 11e and 11f for temporarily storing transmission and reception data, output resistance value adjustment units 100d, 100e and 100f for adjusting the output resistance values of the output circuits 2d, 2e and 2f by control signals Cd, Ce and Cf, selectors 10d, 10e and 10f for selecting transmission data of the switch 9, a data line 16 for receiving the output resistance value adjustment request signal issued from the adjustment request signal issuing unit 200, a data line 12 for transmitting the output resistance value adjustment request signal from the switch 9 to the LSIs 1a, 1b and 1c and an adjustment request signal supply unit 300 for supplying the output resistance value adjustment request signal.

The hot-plug-in information control signal 17 is issued from the printed circuit board only during a predetermined period immediately after the printed circuit board with the LSIS mounted thereon is inserted into this semiconductor integrated circuit system in a hot-plug-in fashion.

During a predetermined period in which the hot-plug-in information control signal 17 is being issued, the output resistance value adjustment unit of the LSI mounted on the printed circuit board which is inserted into this semiconductor integrated circuit system in a hot-plug-in fashion adjusts the output resistance value of the output circuit of the corresponding LSI. Also, the output resistance value adjustment units 100d, 100e and 100f of the LSIs of the switch 9 for executing the signal transmission with the above LSI adjust the output resistance value of the output circuit of the corresponding LSI. According to this method, since the adjustment of the output resistance value ends before the signal transmission between the printed circuit board, which is inserted into the semiconductor integrated circuit system in a hot-plug-in fashion, and the switch 9, is executed, the initial adjustment becomes possible without stopping the signal transmission. Also, it becomes possible to adjust the output resistance value of only the LSI which needs the adjustment.

The interrupt signal issuing unit 14 issues the interrupt signal to the LSI 1a in the case of the power-on reset and when the count value of the counter 52 becomes equal to a predetermined value n.

The LSI 1a which receives the interrupt signal issues the output resistance value adjustment request signal to the adjustment request signal supply unit 300 of the switch 9.

The adjustment request signal supply unit 300 which receives the output resistance value adjustment request signal supplies the output resistance value adjustment request signal to the LSIs 1a, 1b and 1c and the output resistance value adjustment units 100a to 100f in the switch 9.

The output resistance value adjustment units 100a to 100f stop the signal transmission among the LSIs, match the output resistance values of the output circuits 2a to 2f with the characteristic impedances of the transmission lines 6a, 6b and 6c by the well-known method such as one described in U.S. Pat. No. 4,719,369 (JP-A-62-38616) or Digest of Technical Papers of International Solid-state Circuit Conference 95 (February, 1995, pp. 40 to 41), and maintain the output resistance values until the output resistance value adjustment units 100a to 100f receive the next output resistance value adjustment request signal.

Figure 8:
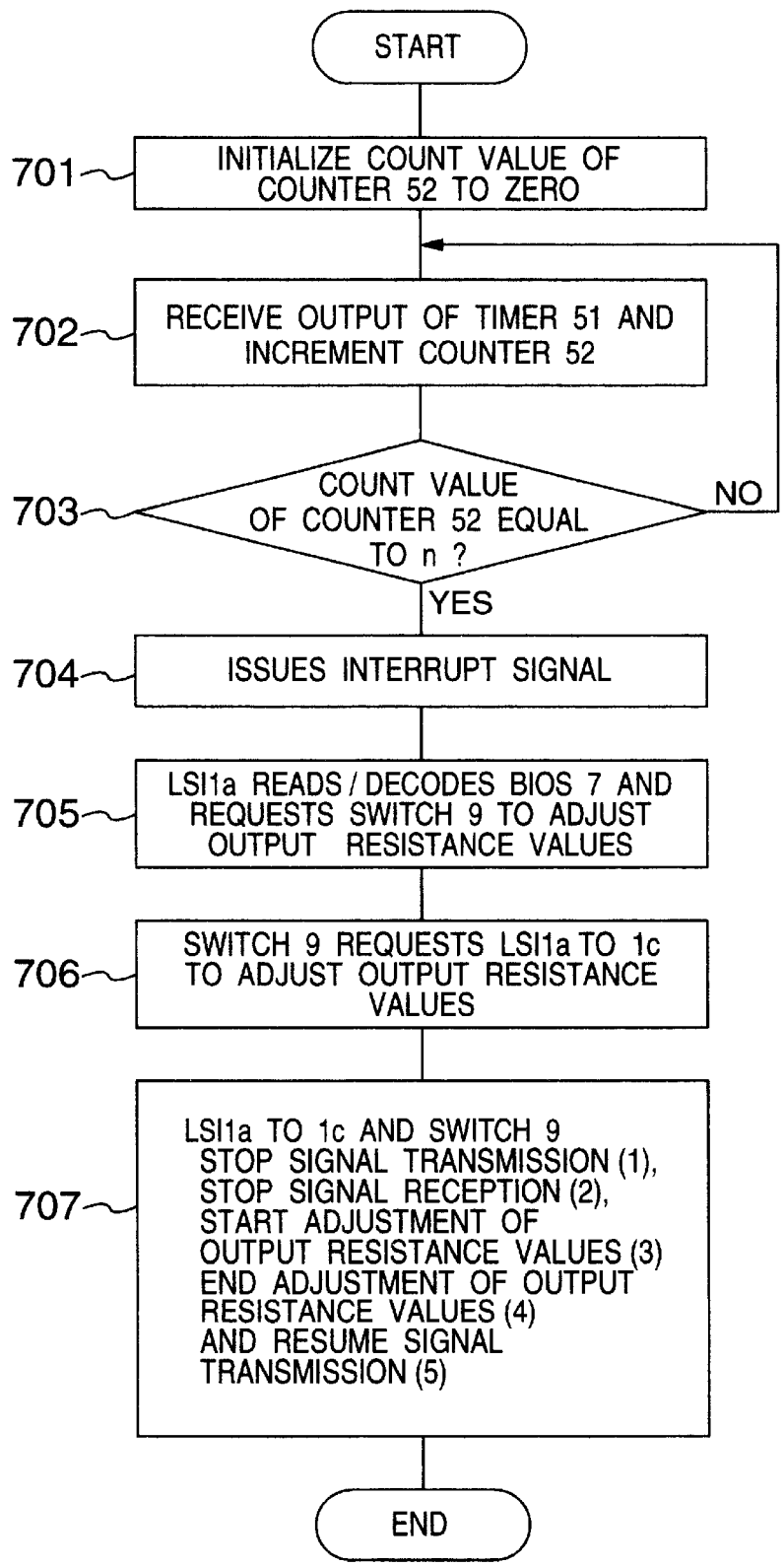
FIG. 8 is a flowchart of the operation in which an output resistance value is adjusted after a power-on reset of the semiconductor integrated circuit system according to the embodiment shown in FIG. 7.

FIG. 8 is a flowchart used to explain the operation of the semiconductor integrated circuit system 3000 which adjusts the output resistance value after the power-on reset.

Referring to FIG. 8, following the start of operation, in a step 701, the counter 52 is initialized to "zero". In a step 702, the counter 52 is incremented each time the output of the timer 51 is received. It is determined in the next decision step 703 whether or not the count value of the counter 52 reaches n (n is an integer equal to or greater than 1 corresponding to the time when the temperatures of the LSIs 1a and 1b increase and become substantially constant). If the count value of the counter 52 does not yet reach n as represented by a NO at the decision step 703, then control goes back to the step 702. If on the other hand the count value of the counter 52 reaches n as represented by a YES at the decision step 703, then control goes to a step 704. In the step 704, the interrupt signal issuing apparatus 14 issues the interrupt signal to the LSI 1a through the interrupt signal line 15. In a step 705, the LSI 1a which receives the interrupt signal reads/decodes information in the BIOS 7, and issues the output resistance value adjustment request signal to the switch 9 through the transmission line 6a similarly to the case in which the ordinary request signal is issued to the switch 9. In a step 706, when the output resistance value adjustment request signal is inputted through the input circuit 3d and the data line 16 to the adjustment request signal supply unit 300, the adjustment request signal supply unit 300 supplies the output resistance value adjustment request signal to the output resistance value adjustment units 100d, 100e and 100f. Also, the adjustment request signal supply unit 300 supplies the output resistance value adjustment request signal to the data line 12. The output resistance value adjustment request signal on this data line 12 is outputted preferentially by the selectors 10d, 10e and 10f to the transmission lines 6a, 6b and 6c. The output resistance value adjustment request signal outputted onto these transmission lines 6a, 6b and 6c are transmitted through the input circuits 3a, 3b and 3c and the data lines 13a, 13b and 13c of the LSIs 1a, 1b and 1c to the output resistance value adjustment units 100a, 100b and 100c.

In the next step 707, the output resistance value adjustment units 100a to 100f of the LSIs 1a to 1c and the switch 9 start the counting by internal counters (not shown) from a time point at which the output resistance value adjustment request signal is received, and operate to stop the signal transmission, stop the signal reception, start the adjustment of the output resistance values, end the adjustment of the output resistance values, and resume the signal transmission in accordance with the count values, in that order.

According to the above-described semiconductor integrated circuit system 3000, since the output resistance values are adjusted at the time of the power-on reset, even when the temperatures detected from the LSIs 1a, 1b, 1c and the switch 9 immediately after the power-on reset are low, the impedances can be matched. Also, when the temperatures of the LSIs 1a, 1b, 1c and the switch 9 increase and become substantially constant after the power-on reset, the output resistance values are again adjusted. Thus, even when the temperatures of the LSIs 1a, 1b, 1c and the switch 9 increase due to the operation of the semiconductor integrated circuit system, the impedances can be matched. Moreover, when the output resistance values are adjusted after the power-on reset, the signal transmission is stopped, so that the output resistance values may be adjusted without causing a malfunction. Further, since the output resistance value adjustment request signal is transmitted through the transmission lines 6a, 6b and 6c, it is possible to reduce the number of the interface signals of each LSI. Furthermore, when the printed circuit board is inserted into the semiconductor integrated circuit system in a hot-plug-in fashion, it is possible to automatically adjust the output resistance value of the LSI which executes the signal transmission between the LSI mounted on the printed circuit board and the LSI.

Incidentally, when the fluctuations of the temperatures of the LSIs 1a to 1c and the switch 9 are large in the normal operation, the flowchart of FIG. 8 may be repeated and the adjustment of the output resistance value may be repeated at every constant time. At that time, the value of n may be determined in consideration of the speed at which the temperature is fluctuated.

Also, of the LSIs in the switch 9, the output resistance of the LSI which executes the signal transmission with a printed circuit board which is not yet inserted into this semiconductor integrated circuit system may be constantly held in the adjustment state, so that the adjustment of the output resistance value of the above-described LSI may be completed in response to the hot-plug-in information control signal 17 issued when the printed circuit board, not yet inserted into this semiconductor integrated circuit system, is inserted into this system in a hot-plug-in fashion. On the other hand, the power-on reset may be effected on the LSI of the printed circuit board that is inserted into this semiconductor integrated circuit system in a hot-plug-in fashion, so that the output resistance value of the LSI of the printed circuit board may be adjusted during that power-on reset. According to this method, the adjustment of the output resistance value is ended before the ordinary signal transmission between the printed circuit board, which is inserted into the semiconductor integrated circuit system in a hot-plug-in fashion, and the switch 9, is executed. Thus, it becomes possible to execute the initial adjustment without stopping the signal transmission. Moreover, it becomes possible to adjust the output resistance value of only the LSI which needs the adjustment.

Also, when a printed circuit board is inserted into the semiconductor integrated circuit system in a hot-plug-in fashion, the interrupt signal may be issued from the interrupt signal generating apparatus 14, so that the output resistance values of all LSIs may be adjusted.

Figure 9:
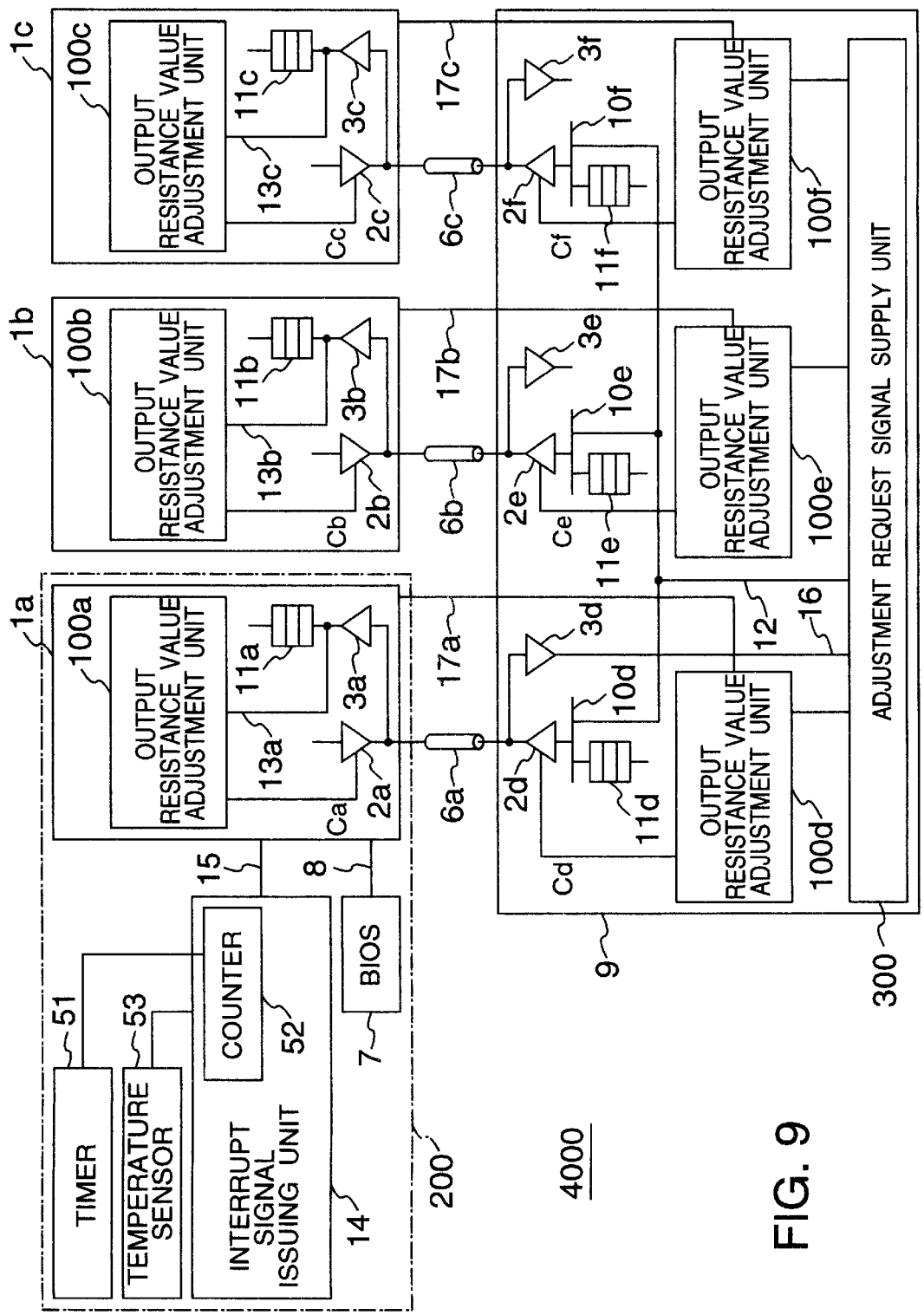
FIG. 9 is a block diagram showing a semiconductor integrated circuit according to a further embodiment of the present invention.

FIG. 9 is a block diagram showing a semiconductor integrated circuit system according to a still further embodiment of the present invention.

As shown in FIG. 9, this semiconductor integrated circuit system 4000 differs from the semiconductor integrated circuit system 3000 according to the last-mentioned embodiment in that the adjustment request signal issuing unit 200 includes the temperature sensor 53. A rest of the arrangement of the semiconductor integrated circuit system 4000 is the same as that of the semiconductor integrated circuit system 3000, and therefore need not be described.

The temperature sensor 53 directly or indirectly monitors the temperatures of the LSIs 1a, 1b and 1c and the switch 9.

The interrupt signal issuing apparatus 14 checks the output of the temperature sensor 53 constantly or at a timing in which the count value of the counter 52 reaches n, and issues the interrupt signal when the temperature fluctuation from the measured temperature fluctuation obtained in the previous adjustment exceeds a predetermined value.

According to the semiconductor integrated circuit system of the aforementioned embodiments, the output resistance value of the output circuit are permitted to be adjusted at the temperature at which the LSI is operating normally. Therefore, even when the temperature of the LSI is fluctuated, it becomes possible to match the output resistance value with the impedance of the transmission line. Hence, a high-speed signal transmission becomes possible.

Furthermore, according to the semiconductor integrated circuit system of the aforementioned embodiments, when a printed circuit board is inserted into the semiconductor integrated circuit system in a hot-plug-in fashion, the output resistance value of the output circuit of the LSI on the printed circuit board can be adjusted automatically. Therefore, it becomes possible to immediately match the output resistance value of the LSI on the printed circuit board, which is inserted into the semiconductor integrated circuit system in a hot-plug-in fashion, with the impedance of the transmission line. Hence, a high-speed signal transmission becomes possible.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor integrated circuit system comprising:
   at least one transmission line having a predetermined characteristic impedance;
   a plurality of semiconductor integrated circuits for transmitting a signal through said transmission line;
   a request signal issuing circuit for issuing an output resistance value adjustment request signal to said plurality of integrated circuits under predetermined conditions, said predetermined conditions being at least any one of (i) during a power-on reset, (ii) after a predetermined time elapses from the releasing of the power-on reset, (iii) at a constant time interval, and (iv) when an arbitrary temperature fluctuation of said plurality of integrated circuits exceeds a predetermined width; and
   a plurality of output resistance value adjusting circuits, each connected to one of said plurality of integrated circuits, wherein each output resistance value adjusting circuit stops the transmission of a signal of an associated integrated circuit in response to said output resistance value adjustment request signal, and adjusts the output resistance value of said integrated circuit in such a manner that the output resistance value is substantially matched with a predetermined characteristic impedance of said transmission line.

2. The semiconductor integrated circuit system according to claim 1, further comprising a separate signal line for transmitting said output resistance value adjustment request signal.

3. The semiconductor integrated circuit system as claimed in claim 1, wherein each of said plurality of semiconductor integrated circuits includes a pin for receiving said output resistance value adjustment request signal.

4. The semiconductor integrated circuit system as claimed in claim 1, wherein said output resistance value adjustment request signal is transmitted through said at least one transmission line.

5. The semiconductor integrated circuit system according to claim 1, further comprising a switch circuit disposed intermediately of said transmission line for relaying the signal transmission among said plurality of integrated circuits and wherein said output resistance adjustment request signal is supplied through said transmission line and said switch circuit.

6. The semiconductor integrated circuit system as claimed in claim 1, wherein each of said plurality of semiconductor integrated circuits includes at least one output circuits connected to said transmission line.

7. The semiconductor integrated circuit system as claimed in claim 1, wherein said request signal issuing circuit includes a timer, a counter cleared by said power-on reset and a control unit for generating said output resistance value adjustment request signal in at least any one of the cases where (i) said power-on is reset, (ii) when a count value of said counter reaches a predetermined value after said power-on reset is released, and (iii) each time the count value of said counter reaches another predetermined value.

8. The semiconductor integrated circuit system as claimed in claim 7, wherein said request signal generating circuit further includes a temperature sensor for monitoring temperatures of said plurality of integrated circuits and said control circuit generates said output resistance value adjustment request signal when a temperature fluctuation of any one of said plurality of integrated circuits exceeds a predetermined amount.

9. The semiconductor integrated circuit system as claimed in claim 1, wherein said request signal issuing circuit includes: a basic input/output system; an interrupt signal issuing apparatus for issuing an interrupt signal after a predetermined time elapsed since a power-on reset; and a further semiconductor integrated circuit for generating said output resistance value adjustment request signal by reading/decoding information stored in said basic input/output system in response to said interrupt signal.

10. The semiconductor integrated circuit system according to claim 9, further comprising a switch circuit disposed intermediately of said transmission line for relaying the signal transmission among said plurality of integrated circuits and a further transmission line for connecting said further semiconductor integrated circuit and said switch circuit and wherein said output resistance value adjustment request signal is supplied through at least one of said transmission lines and said further transmission line to said output resistance value adjustment circuits of said plurality of integrated circuits.

11. The semiconductor integrated circuit system as claimed in claim 9, wherein said adjustment request signal generating circuit further includes a temperature sensor for monitoring temperatures of said plurality of semiconductor integrated circuits and wherein said interrupt signal issuing apparatus monitors an output of said temperature sensor and issues said interrupt signal when any of temperature fluctuations of said plurality of semiconductor integrated circuits exceeds a predetermined width.

12. A semiconductor integrated circuit system comprising:

at least one transmission line having a predetermined characteristic impedance;

a plurality of semiconductor integrated circuits for transmitting a signal through said transmission line, at least one of said plurality of integrated circuits being mounted on an insertable printed circuit board, and each of said plurality of integrated circuits having at least one output circuit connected to said transmission line; and a plurality of output resistance value adjustment circuits, one connected to each of said output circuits, for adjusting output resistance values of said output circuits in such a manner that said output resistance values approach to a predetermined characteristic impedance of said transmission line, wherein said output resistance value adjustment circuit connected to said output circuit of said integrated circuit mounted on said printed circuit board adjusts the output resistance value of said output circuit for a predetermined time period after said printed circuit board is inserted in a hot-plug-in fashion during said semiconductor integrated circuit system is operating in such a manner that said output resistance value is matched with said predetermined characteristic impedance of said transmission line.

13. The semiconductor integrated circuit system according to claim 12, further comprising control signal issuing means for issuing a hot-plug-in information control signal to another integrated circuit connected to said transmission line when said printed circuit board is inserted in a hot-plug-in fashion during said semiconductor integrated circuit system is operating and wherein said another integrated circuit receives said hot-plug-in information control signal, and an output resistance value adjusting circuit of said another integrated circuit adjusts an output resistance value of an output circuit of said another integrated circuit in such a manner that said output resistance value is substantially matched with a predetermined characteristic of said transmission line.

14. A method of adjusting output resistance values of a plurality of semiconductor integrated circuits in a semiconductor integrated circuit system in which signal transmission occurs among a plurality of semiconductor integrated circuits through at least one transmission line, comprising the steps of:

issuing an output resistance value adjustment request signal in at least any one of cases in which (i) during a power-on rest, (ii) after a predetermined time elapsed since the power-on reset has been released, (iii) at constant time intervals, and (iv) when a temperature fluctuation of any one of said plurality of semiconductor integrated circuit exceeds a predetermined width;

stopping the signal transmission in said plurality of semiconductor integrated circuits in response to said adjustment request signal;

adjusting the output resistance values of said semiconductor integrated circuits by output resistance value adjusting means provided at each of said plurality of semiconductor integrated circuits; and starting the signal transmission in said plurality of semiconductor integrated circuits.

15. The method of adjusting output resistance values of said plurality of semiconductor integrated circuits as claimed in claim 14, wherein said step of adjusting said output resistance values includes a step for matching the output resistance values of said plurality of semiconductor integrated circuit with a characteristic impedance of said transmission line.

16. A method of automatically adjusting output resistance values of a plurality of semiconductor integrated circuits in a semiconductor integrated circuit system in which signal transmission occurs among said plurality of semiconductor integrated circuits through at least one transmission line, comprising the steps of:

measuring temperatures of said semiconductor integrated circuits by a temperature sensor when a count value obtained from a counter by a timer attains a predetermined value; and issuing an output resistance value adjustment request signal from a control apparatus to an output resistance value adjusting unit provided within each of said semiconductor integrated circuits when a temperature fluctuation from a previous temperature measured value is equal to a greater than a predetermined width; wherein said output resistance value adjusting unit stops the signal transmission among said semiconductor integrated circuits in response to said output resistance value adjustment request signal, adjusts output resistance values of output circuits provided within said semiconductor integrated circuits in such a manner that said output resistance values are matched with a characteristic impedance of said transmission line, and maintains said adjusted output resistance values until said output resistance value adjusting unit receives next output resistance value adjustment request signal.

* * * * *